(12) United States Patent
Viard

(10) Patent No.: US 10,521,524 B2
(45) Date of Patent: Dec. 31, 2019

(54) METHODS AND SYSTEMS FOR BOUNDING BOX CLIPPING

(71) Applicant: SCHLUMBERGER TECHNOLOGY CORPORATION, Sugar Land, TX (US)

(72) Inventor: Thomas Lucas Viard, Montpellier (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 323 days.

(21) Appl. No.: 15/395,947

(22) Filed: Dec. 30, 2016

(65) Prior Publication Data
US 2018/0189429 A1   Jul. 5, 2018

(51) Int. Cl.
*G06F 17/50* (2006.01)

(52) U.S. Cl.
CPC ................... *G06F 17/5009* (2013.01)

(58) Field of Classification Search
CPC .................................................. G06F 17/5009
See application file for complete search history.

(56) References Cited

U.S. PATENT DOCUMENTS

| | | | | |
|---|---|---|---|---|
| 6,018,497 A * | 1/2000 | Gunasekera | ............ | G01V 1/28 367/38 |
| 8,965,745 B2 | 2/2015 | Lepage | | |
| 2005/0203725 A1* | 9/2005 | Jenny | ...................... | E21B 43/00 703/10 |
| 2005/0273303 A1* | 12/2005 | Flandrin | ................. | G06T 17/20 703/10 |
| 2008/0208539 A1* | 8/2008 | Lee | ......................... | E21B 49/00 703/1 |
| 2009/0281776 A1* | 11/2009 | Cheng | ..................... | E21B 43/00 703/2 |
| 2010/0017181 A1* | 1/2010 | Mouton | .................. | G06T 17/20 703/9 |
| 2014/0136171 A1 | 5/2014 | Sword, Jr. et al. | | |
| 2017/0212773 A1* | 7/2017 | Pecher | ................... | G06Q 50/02 |

OTHER PUBLICATIONS

Aziz, "Reservoir Simulation Grids: Opportunities and Problems," Journal of Petroleum Technology, 1993, vol. 45, Issue 7, pp. 658-663.
Mallison, et al., "Unstructured Cut-Cell Grids for Modeling Complex Reservoirs," SPE Reservoir Simulation Symposium, Woodlands, Texas USA 2013.
Mallison, et al., "Unstructured Cut-Cell Grids for Modeling Complex Reservoirs," SPE Journal, 2014, vol. 19, No. 02, pp. 340-352.
Wey, et al., "Simulation of a Single-Element Lean-direct Injector Combustor Using Arbitrary Polyhedral Mesh," the 50th AIAA Aerospace Sciences Meeting, Jan. 9, 2012.

* cited by examiner

*Primary Examiner* — Hyun D Park
(74) *Attorney, Agent, or Firm* — Jaime A. Castano

(57) ABSTRACT

A method is described in which a polyhedral grid representative of seismic data is provided. A polyhedral cell of the polyhedral grid is identified. A polyhedron that encloses the polyhedral cell is created. A region of the polyhedron to remove based on faces of the identified polyhedral cell is identified. The identified region of the polyhedron is removed. The identifying and removing are repeated for a plurality of faces of the identified polyhedral cell. A pressure center of the polyhedral cell is determined.

22 Claims, 9 Drawing Sheets

METHODS AND SYSTEMS FOR BOUNDING BOX CLIPPING

BACKGROUND

The economic recovery of natural resources such as oil is extremely difficult. Prediction of the flow in a reservoir is important in determining a production plan. Accurately predicting the flow in a reservoir for the production plan can make the difference between a successful well and an uneconomical well.

Seismic surveys may be used to collect rock and soil information that may in turn be used to locate faults and estimate fluid flow in the substrata. When different types of substrata meet (for example, at a discontinuity), determining the behavior of fluids across the boundary is problematic. Known approaches are either costly and difficult to implement or inaccurately approximate a fault geometry. In such prior techniques, estimations or assumptions may be used to fix the data such that a calculation can be completed. However, this introduces numerical errors up to and including inadvertent modelling of non-physical behaviors. In a grid based approach to modelling the substrata, the grid needs to provide the same functionality as the more traditional approaches, including the ability to run flow simulations. One of the implications of flow simulations for a grid based approach is that for every single cell, a center that fits the requirements of a pressure center must be determinable.

Accordingly, methods and systems for accurate analysis, such as flow simulation, is desirable.

BRIEF SUMMARY

In an exemplary embodiment of a method according to the present disclosure, a polyhedral grid representative of seismic data is provided. A polyhedral cell of the polyhedral grid is identified. A polyhedron that encloses the polyhedral cell is created. A region of the polyhedron to remove based at least in part on one or more faces of the identified polyhedral cell is identified. The identified region of the polyhedron is removed. The identifying and removing are repeated for a plurality of faces of the identified polyhedral cell. A pressure center of the polyhedral cell is determined.

In another exemplary embodiment of a method according to the present disclosure, a polyhedral grid representative of seismic data is provided. A polyhedral cell of the polyhedral grid is identified. A bounding box of the polyhedral cell is determined. For each face of the identified polyhedral cell, a plane and a vector normal to the plane is defined. A plane that intersects the polyhedral cell is identified. The bounding box of the polyhedral cell is split based at least in part on the plane. A portion of the bounding box is discarded based on the plane. The pressure center is determined from the modified bounding box.

In another exemplary embodiment, geophysics processor includes a receiving portion, an identification portion and a processing portion. The receiving portion is configured to provide a polyhedral grid representative of seismic data. The identification portion is configured to identify a polyhedral cell, create a polyhedron that encloses the polyhedral cell, and identify a region of the polyhedron. The processing portion is configured to identify a portion of the region of the polyhedron to remove based on faces of the identified polyhedral cell, and to remove the identified portion of the region. The processing portion and the identifying portion are configured to continue the identifying and processing for a plurality of faces of the identified polyhedral cell.

BRIEF DESCRIPTION OF THE DRAWINGS

For a better understanding of the aforementioned embodiments as well as additional embodiments thereof, reference should be made to the Detailed Description below, in conjunction with the following drawings in which like reference numerals refer to corresponding parts throughout the figures.

FIG. 7B illustrates a step of an exemplary division of a polygonal surface.

FIG. 7C illustrates a step of an exemplary division of a polygonal surface.

FIG. 7D illustrates a step of an exemplary division of a polygonal surface.

FIG. 7E illustrates a step of an exemplary division of a polygonal surface.

DETAILED DESCRIPTION

Figure 1A:
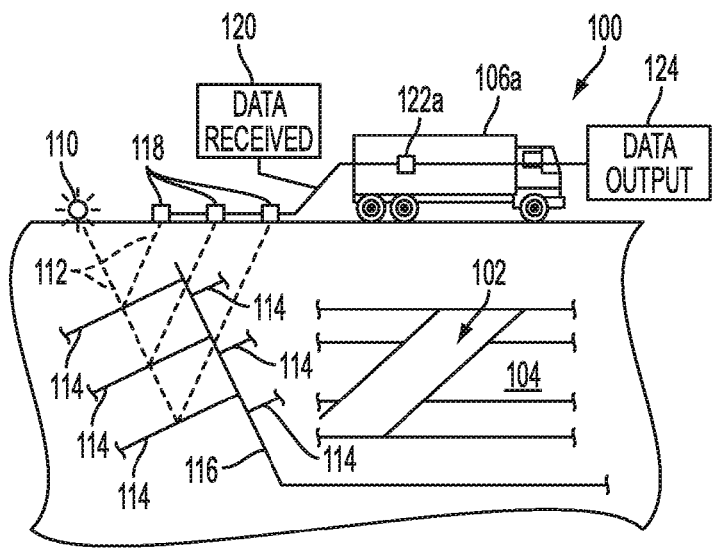
FIG. 1A illustrates a simplified schematic view of a survey operation performed by a survey tool at an oil field.

Reference will now be made in detail to embodiments, examples of which are illustrated in the accompanying drawings and figures. In the following detailed description, numerous specific details are set forth in order to provide a thorough understanding of the invention. However, it will be apparent to one of ordinary skill in the art that the invention may be practiced without these specific details. In other instances, well-known methods, procedures, components, circuits and networks have not been described in detail so as not to unnecessarily obscure aspects of the embodiments.

It will also be understood that, although the terms first, second, etc., may be used herein to describe various elements, these elements should not be limited by these terms. These terms are used to distinguish one element from another. For example, a first object or step could be termed a second object or step, and, similarly, a second object or step could be termed a first object or step, without departing from the scope of the invention. The first object or step, and the second object or step, are both objects or steps, respectively, but they are not to be considered the same object or step.

The terminology used in the description of the invention herein is for the purpose of describing particular embodiments and is not intended to be limiting of the invention. As used in the description of the invention and the appended claims, the singular forms "a," "an" and "the" are intended to include the plural forms as well, unless the context clearly indicates otherwise. It will also be understood that the term "and/or" as used herein refers to and encompasses any possible combination of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context.

Those with skill in the art will appreciate that while some terms in this disclosure may refer to absolutes, e.g., all of the components of a wavefield, all source receiver traces, each of a plurality of objects, etc., the methods and techniques disclosed herein may also be performed on fewer than all of a given thing, e.g., performed on one or more components and/or performed on one or more source receiver traces. Accordingly, in instances in the disclosure where an absolute is used, the disclosure may also be interpreted to be referring to a subset.

The computing systems, methods, processing procedures, techniques and workflows disclosed herein are more efficient and/or effective methods for identifying, isolating, transforming, and/or processing various aspects of data that is collected from a subsurface region or other multi-dimensional space to enhance flow simulation prediction accuracy. The described methods and apparatus provide a new technological solution to the petroleum engineering problems described herein. Embodiments are directed to new and specialized processing apparatus and methods of using the same. Flow simulation prediction according to the present application implicate a new processing approach (e.g., hardware, special purpose processors, specially programmed general purpose processors) because such analyses are too complex and cannot be done by a person in the time available or at all. Thus, the apparatus and method of the claims are directed to tangible implementations or solutions to a specific technological problem in the seismic field.

Figure 1B:
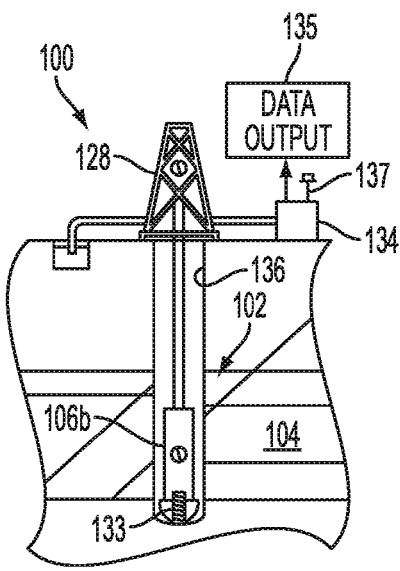
FIG. 1B illustrates a simplified schematic view of a drilling operation performed by drilling tools.
Figure 1C:
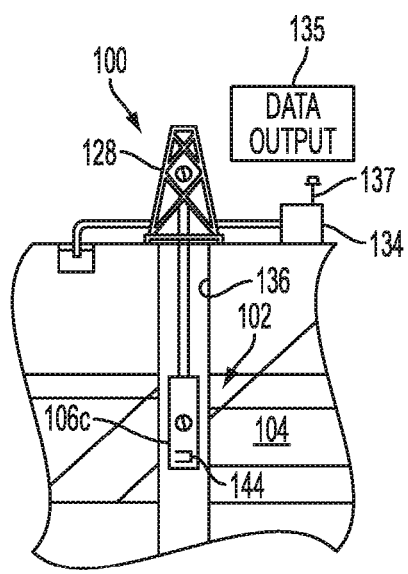
FIG. 1C illustrates a simplified schematic view of a production operation performed by a production tool.

FIGS. 1A-1C illustrate simplified, schematic views of oilfield 100 having subterranean formation 102 containing reservoir 104 therein in accordance with implementations of various technologies and techniques described herein. FIG. 1A illustrates a survey operation being performed by a survey tool, such as seismic truck 106a, to measure properties of the subterranean formation. The survey operation is a seismic survey operation for producing sound vibrations. In FIG. 1A, one such sound vibration, e.g., sound vibration 112 generated by source 110, reflects off horizons 114 in earth formation 116. A set of sound vibrations is received by sensors, such as geophone-receivers 118, situated on the earth's surface. The data received 120 is provided as input data to a computer 122a of the seismic truck 106a, and responsive to the input data, computer 122a generates seismic data output 124. This seismic data output may be stored, transmitted or further processed as desired, for example, by data reduction.

FIG. 1B illustrates a drilling operation being performed by drilling tools 106b suspended by rig 128 and advanced into subterranean formations 102 to form wellbore 136. The drilling tools are advanced into subterranean formations 102 to reach reservoir 104. Each well may target one or more reservoirs. The drilling tools may be adapted for measuring downhole properties using logging while drilling tools. The logging while drilling tools may also be adapted for taking core sample 133 as shown.

The drilling tool 106b may include downhole sensor S adapted to perform logging while drilling (LWD) data collection. The sensor S may be any type of sensor.

Computer facilities may be positioned at various locations about the oilfield 100 (e.g., the surface unit 134) and/or at remote locations. Surface unit 134 may be used to communicate with the drilling tools and/or offsite operations, as well as with other surface or downhole sensors. Surface unit 134 is capable of communicating with the drilling tools to send commands to the drilling tools, and to receive data therefrom. Surface unit 134 may also collect data generated during the drilling operation and produce data output 135, which may then be stored or transmitted.

Sensors (S), such as gauges, may be positioned about oilfield 100 to collect data relating to various oilfield operations as described previously. As shown, sensor (S) is positioned in one or more locations in the drilling tools and/or at rig 128 to measure drilling parameters, such as weight on bit, torque on bit, pressures, temperatures, flow rates, compositions, rotary speed, and/or other parameters of the field operation. Sensors (S) may also be positioned in one or more locations in the circulating system.

Drilling tools 106b may include a bottom hole assembly (BHA) (not shown), generally referenced, near the drill bit (e.g., within several drill collar lengths from the drill bit). The bottom hole assembly includes capabilities for measuring, processing, and storing information, as well as communicating with surface unit 134. The bottom hole assembly further includes drill collars for performing various other measurement functions.

The bottom hole assembly may include a communication subassembly that communicates with surface unit 134. The communication subassembly is adapted to send signals to and receive signals from the surface using a communications channel such as mud pulse telemetry, electro-magnetic telemetry, or wired drill pipe communications. The communication subassembly may include, for example, a transmitter that generates a signal, such as an acoustic or electro-magnetic signal, which is representative of the measured drilling parameters. It will be appreciated by one of skill in the art that a variety of telemetry systems may be employed, such as wired drill pipe, electromagnetic or other known telemetry systems.

The data gathered by sensors (S) may be collected by surface unit 134 and/or other data collection sources for analysis or other processing. An example of the further processing is the generation of a grid for use in the computation of a juxtaposition diagram as discussed below. The data collected by sensors (S) may be used alone or in combination with other data. The data may be collected in one or more databases and/or transmitted on or offsite. The data may be historical data, real time data, or combinations thereof. The real time data may be used in real time, or stored for later use. The data may also be combined with historical data or other inputs for further analysis. The data may be stored in separate databases, or combined into a single database.

Surface unit 134 may include transceiver 137 to allow communications between surface unit 134 and various portions of the oilfield 100 or other locations. Surface unit 134 may also be provided with or functionally connected to one or more controllers (not shown) for actuating mechanisms at oilfield 100. Surface unit 134 may then send command signals to oilfield 100 in response to data received. Surface unit 134 may receive commands via transceiver 137 or may itself execute commands to the controller. A processor may be provided to analyze the data (locally or remotely), make the decisions and/or actuate the controller.

FIG. 1C illustrates a production operation being performed by production tool 106D deployed from a production unit or Christmas tree 129 and into completed wellbore 136 for drawing fluid from the downhole reservoirs into surface facilities 142. The fluid flows from reservoir 104 through perforations in the casing (not shown) and into production tool 106d in wellbore 136 and to surface facilities 142 via gathering network 146.

Sensors (S), such as gauges, may be positioned about oilfield 100 to collect data relating to various field operations as described previously. As shown, the sensor (S) may be positioned in production tool 106d or associated equipment, such as Christmas tree 129, gathering network 146, surface facility 142, and/or the production facility.

While FIGS. 1B-1C illustrate tools used to measure properties of an oilfield, it will be appreciated that various measurement tools capable of sensing parameters, such as seismic two-way travel time, density, resistivity, production rate, etc., of the subterranean formation and/or its geological formations may be used. Various sensors (S) may be located at various positions along the wellbore and/or the monitoring tools to collect and/or monitor the desired data. Other sources of data may also be provided from offsite locations.

Figure 2:
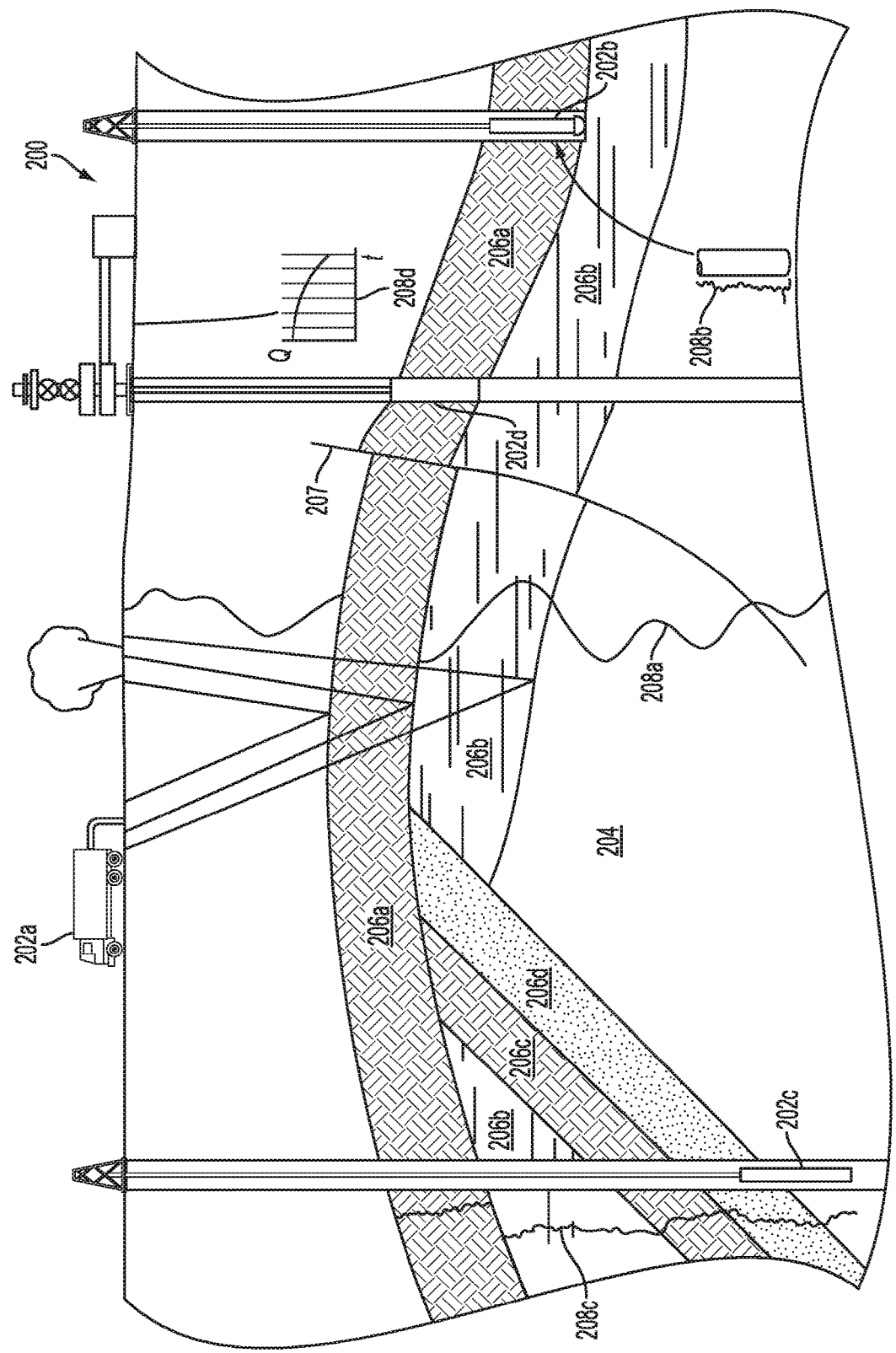
FIG. 2 illustrates a schematic view, partially in cross section, of an oilfield.

The field configurations of FIGS. 1A-1C are intended to provide a brief description of an example of a field usable with oilfield application frameworks. Part, or all, of oilfield 100 may be on land, water, and/or sea. Also, while a single field measured at a single location is depicted, oilfield applications may be utilized with any combination of one or more oilfields, one or more processing facilities and one or more wellsites. An example of processing of data collected by the sensors is the generation of a grid for use in the computation of a juxtaposition diagram as discussed below FIG. 2 illustrates a schematic view, partially in cross section of oilfield 200 having data acquisition tools 202a, 202b, 202c and 202d positioned at various locations along oilfield 200 for collecting data of subterranean formation 204 in accordance with implementations of various technologies and techniques described herein. Data acquisition tools 202a-202d may be the same as data acquisition tools 106a-106d of FIGS. 1A-1C, respectively, or others not depicted. As shown, data acquisition tools 202a-202d generate data plots or measurements 208a-208d, respectively. These data plots are depicted along oilfield 200 to demonstrate the data generated by the various operations.

Data plots 208a-208c are examples of static data plots that may be generated by data acquisition tools 202a-202c, respectively; however, it should be understood that data plots 208a-208c may also be data plots that are updated in real time. These measurements may be analyzed to better define the properties of the formation(s) and/or determine the accuracy of the measurements and/or for checking for errors. The plots of each of the respective measurements may be aligned and scaled for comparison and verification of the properties.

Static data plot 208a is a seismic two-way response over a period of time. Static plot 208b is core sample data measured from a core sample of the formation 204. The core sample may be used to provide data, such as a graph of the density, porosity, permeability, or some other physical property of the core sample over the length of the core. Tests for density and viscosity may be performed on the fluids in the core at varying pressures and temperatures. Static data plot 208c is a logging trace that provides a resistivity or other measurement of the formation at various depths.

A production decline curve or graph 208d is a dynamic data plot of the fluid flow rate over time. The production decline curve provides the production rate as a function of time. As the fluid flows through the wellbore, measurements are taken of fluid properties, such as flow rates, pressures, composition, etc.

Other data may also be collected, such as historical data, user inputs, economic information, and/or other measurement data and other parameters of interest. As described below, the static and dynamic measurements may be analyzed and used to generate models of the subterranean formation to determine characteristics thereof. Similar measurements may also be used to measure changes in formation aspects over time.

The subterranean structure 204 has a plurality of geological formations 206a-206d. As shown, this structure has several formations or layers, including a shale layer 206a, a carbonate layer 206b, a shale layer 206c and a sand layer 206d. A fault 207 extends through the shale layer 206a and the carbonate layer 206b. The static data acquisition tools are adapted to take measurements and detect characteristics of the formations.

While a specific subterranean formation with specific geological structures is depicted, it will be appreciated that oilfield 200 may contain a variety of geological structures and/or formations, sometimes having extreme complexity. In some locations, for example below the water line, fluid may occupy pore spaces of the formations. Each of the measurement devices may be used to measure properties of the formations and/or its geological features. While each acquisition tool is shown as being in specific locations in oilfield 200, it will be appreciated that one or more types of measurement may be taken at one or more locations across one or more fields or other locations for comparison and/or analysis.

The data collected from various sources, such as the data acquisition tools of FIG. 2, may then be processed and/or evaluated. Seismic data displayed in static data plot 208a from data acquisition tool 202a may be used by a geophysicist to determine characteristics of the subterranean formations and features. The core data shown in static plot 208b and/or log data from well log 208c may be used by a geologist to determine various characteristics of the subterranean formation. The production data from graph 208d may be used by the reservoir engineer to determine fluid flow reservoir characteristics. The data analyzed by the geologist, geophysicist and the reservoir engineer may be analyzed using modeling techniques.

Figure 3:
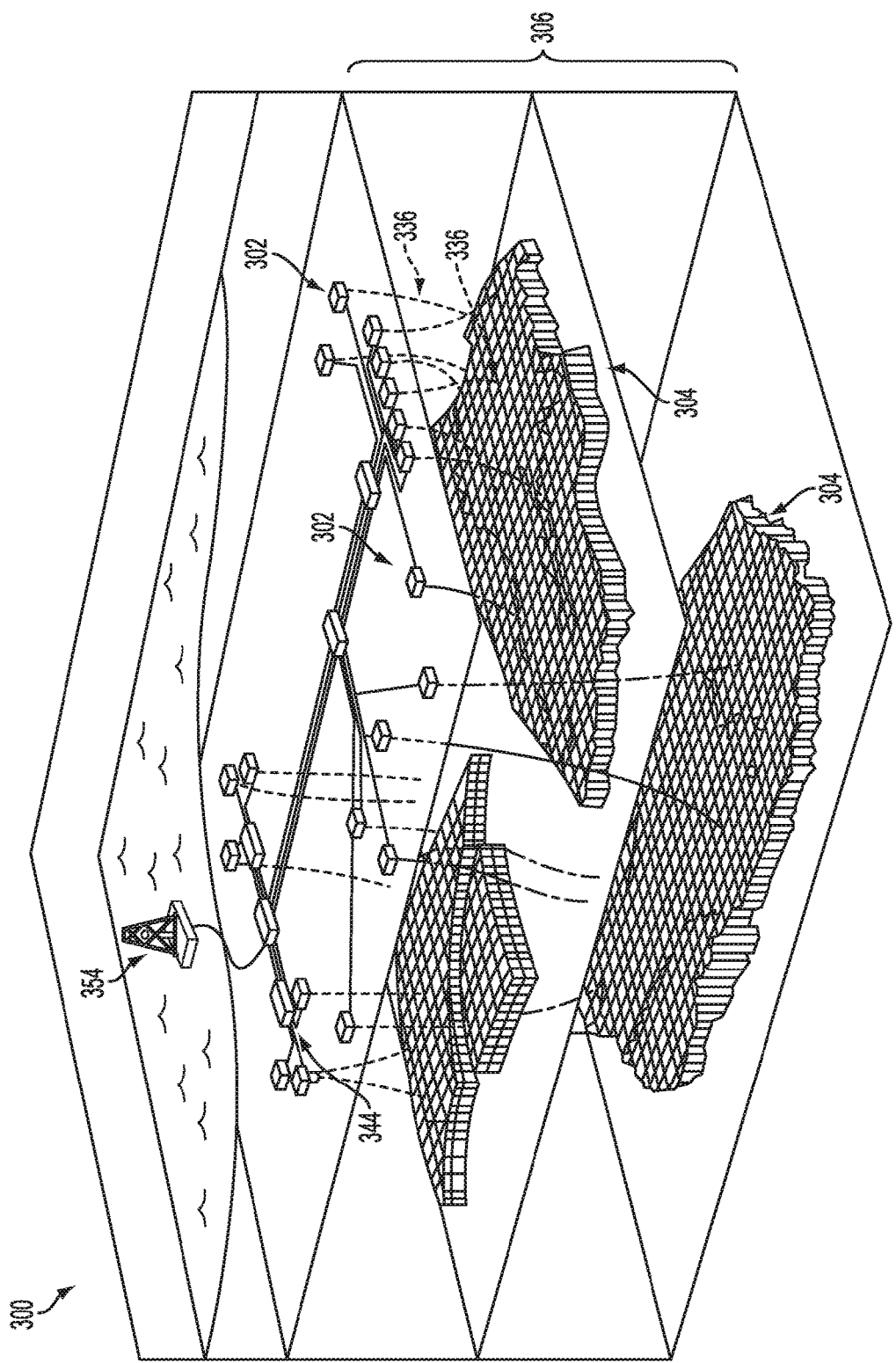
FIG. 3 illustrates a perspective view of an oilfield.

FIG. 3 illustrates an oilfield 300 at which production operations in accordance with implementations of various technologies and techniques described herein may be performed. The oilfield 300 has a plurality of wellsites 302 operatively connected to central processing facility 354. The oilfield configuration of FIG. 3 does not limit the scope of the oilfield application system. The oilfield, or parts thereof, may be on land and/or sea. Also, while a single oilfield with a single processing facility and a plurality of wellsites is depicted, any combination of one or more oilfields, one or more processing facilities and one or more wellsites may be present.

Each wellsite 302 has equipment that forms wellbore 336 into the earth. The wellbores 336 extend through subterranean formations 306 including reservoirs 304. These reservoirs 304 contain fluids, such as hydrocarbons. The wellsites 302 draw fluid from the reservoirs 304 and pass them to the processing facility 354 via surface networks 344. The surface networks 344 have tubing and control mechanisms that control the flow of fluids from the wellsites 302 to the processing facility 354.

Figure 8:
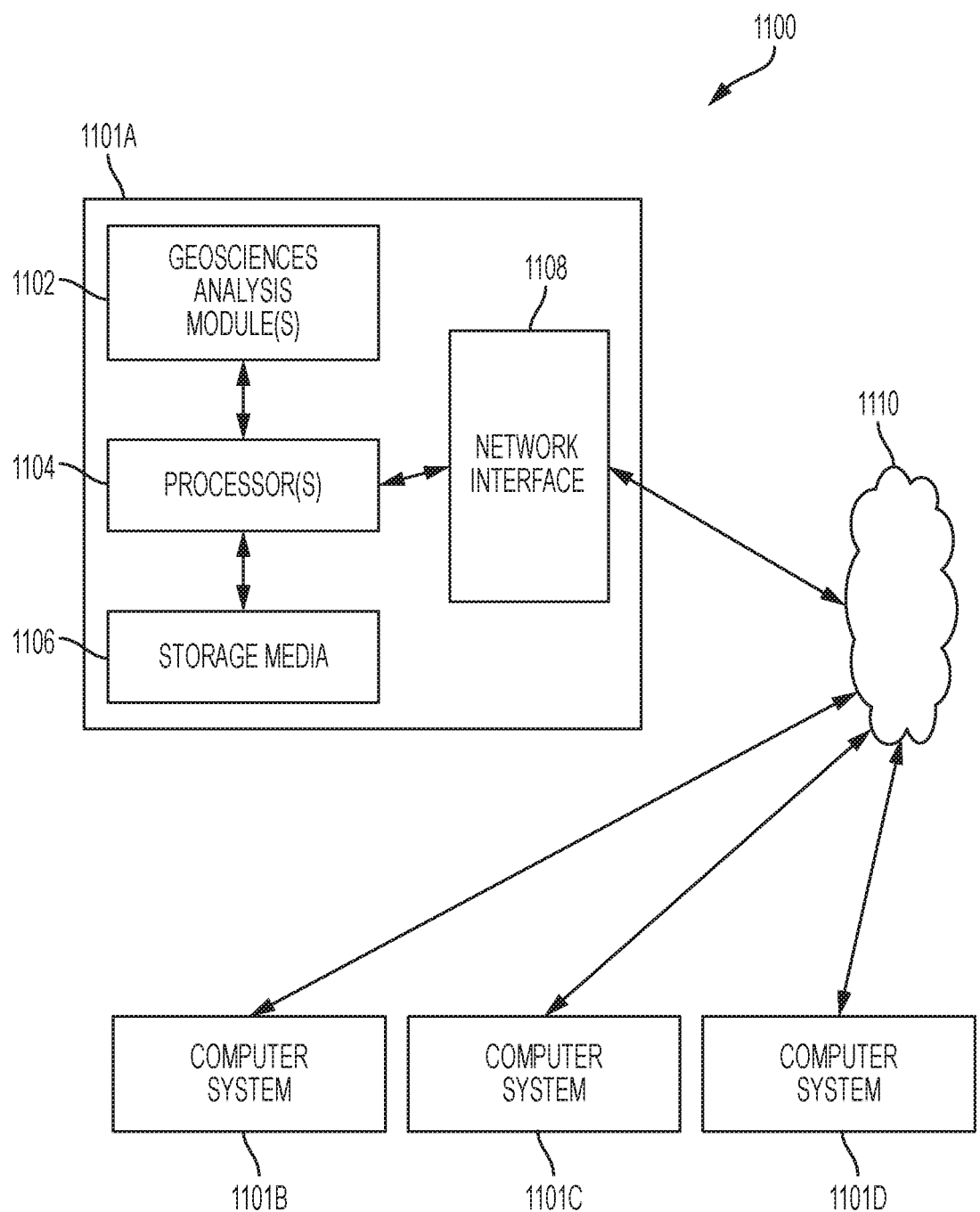
FIG. 8 illustrates an exemplary computing system in accordance with an embodiment.

Attention is now directed to methods, techniques, and workflows for processing and/or transforming collected data that are in accordance with some embodiments. Some operations in the processing procedures, methods, techniques, and workflows disclosed herein may be combined and/or the order of some operations may be changed. Those with skill in the art will recognize that in the geosciences and/or other multi-dimensional data processing disciplines, various interpretations, sets of assumptions, and/or domain models such as drilling plan models, may be refined in an iterative fashion; this concept is applicable to the procedures, methods, techniques, and workflows as discussed herein. This iterative refinement can include use of feedback loops executed on an algorithmic basis, such as at a computing device (e.g., computing system 1100, FIG. 8), and/or through manual control by a user who may make determinations regarding whether a given action, template, or model has become sufficiently accurate. In an embodiment, a graphics processing unit is used to carry the below described process. Graphics processing units are specialized hardware that are designed to carry out calculations on information represented as polygons. Thus, the graphics processing unit is well-suited to provide an efficient and high speed geophysics processor.

A well may be considered successful if it economically recovers natural resources. Prediction of the flow in a reservoir is important in determining a production plan. Bounding box clipping as described in more detail below may reduce or avoid non-physical flow simulation results, which may reduce or avoid incorrect flow predictions. This in turn may change the predicted outcome of a planned well, which affects the decision whether or not to drill.

In an example, a grid is provided with polygons representing different types of stratigraphy of the substrata. It will be appreciated that a polyhedral grid containing polyhedra may be used to represent 3D elements. Such polyhedra may be bounded by a closed set of polygons.

A simplified analogy is a playbox filled with colored sand arranged in layers. The different colors of sand may represent different types of material (e.g., shale, sand, rock) in the stratigraphy. The permeability of layers, which is of interest for determining the flow of fluids such as oil, is dependent on the type of material. Thus, to determine the flow through the material, the amount of one type of material (color of sand) disposed adjacent with other types of material (other colors of sand) is determined to estimate the flow of fluid through the material. Thus, the substrata may be modeled as a series of polygons and it is meaningful to determine the connection between the polygons. Concavities in the polygons may occur, for example in the vicinity of discontinuities. Such concavities that may be concentrated near discontinuities but also found elsewhere in the grid contribute to exotic cell shapes in these areas.

Figure 4:
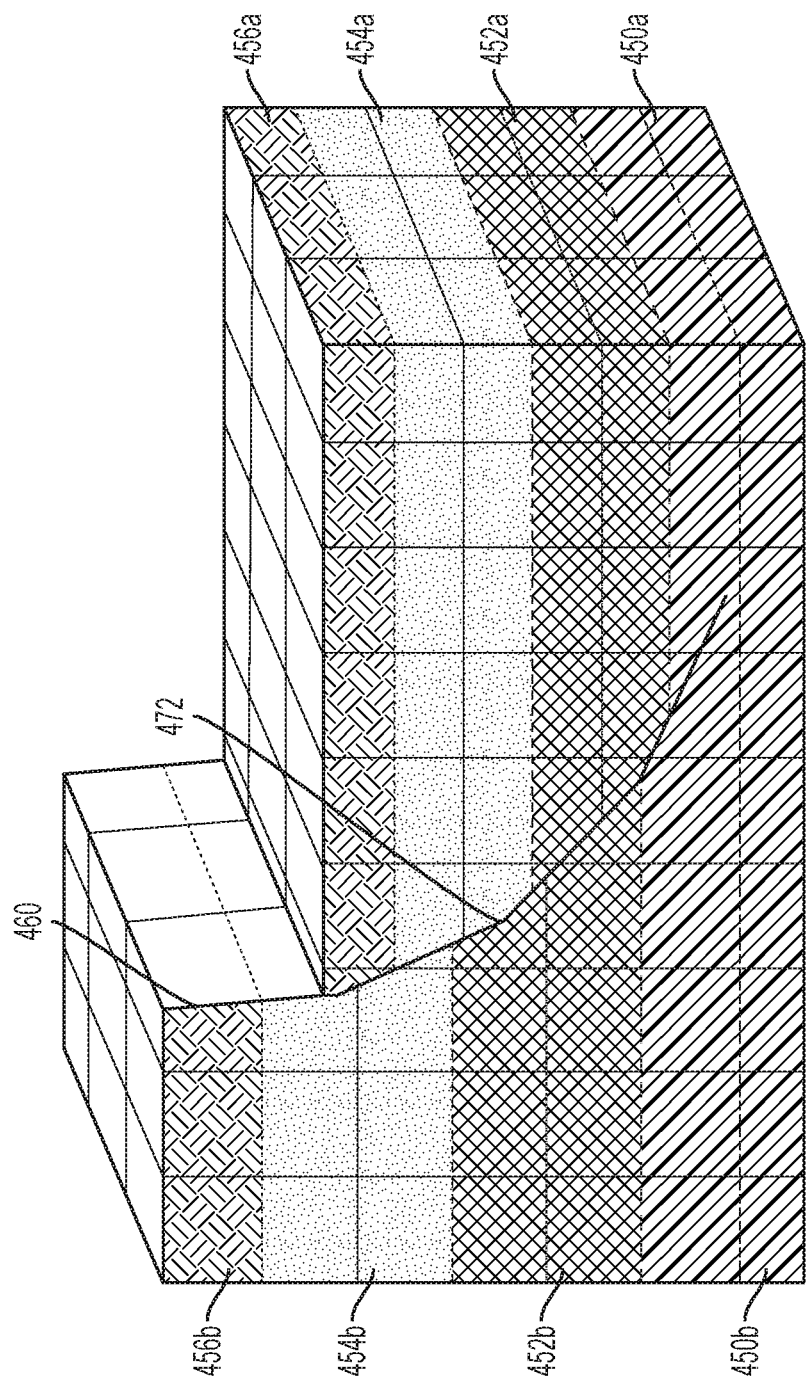
FIG. 4 illustrates an exemplary grid generated from a geochronological model.

FIG. 4 illustrates an unstructured grid generated from a geochronological model. It will be appreciated that the grid illustrated in FIG. 4 is exemplary and the disclosed techniques are applicable to any kind of grid with or without unconformities. Such grids include, but are not restricted to depositional grids and cut-cell grids.

The grid may include layers 450, 452, 454 and 456 illustrate the W parameterization property. Of course, the layers are not necessarily discrete and each layer may further include a gradation in the substrata. Thus, the layers may represent regions of different material (e.g., sand, shale, etc.) as well as gradients thereof or any other property that affects the flow characteristics of the material.

One approach to calculating flow through a grid is a two-point flux approximation (TPFA) scheme; however TPFA is known to introduce numerical errors in the presence of non K-orthogonal interfaces, which are frequent around unconformities—especially when using unstructured simulation grids.

A more advanced scheme such as multiple-point flux approximation (MPFA) may be used address these numerical errors. An MPFA implementation relies on the detection of all the faces around a node to gather the so-called interaction region, which a trivial face-by-face geometrical projection does not easily permit. The issue may be mitigated by welding the grid at unconformities, but this approach is computationally intensive and challenging to implement. A flow simulation-compatible diagram (e.g., a MPFA- or TPFA-compatible diagram) includes diagrams in which the dot product of the normal vector at the middle of an edge and the vector from the center of a cell to the middle of the edge is not-negative for all edges of the cell. Thus, the center of the cell that meets the requirements of a pressure center, such as a barycenter, needs to be determined in order to make sure that the diagram is flow simulation-compatible (or modified to be flow simulation-compatible) and to find the interaction region.

In an embodiment, a processing technique is based on polyhedral clipping to computing such a center for a polyhedral cell. This technique may provide a solution, provided such a solution exists, which may not be true for heavily concave cells.

Preferably, a pressure center is found for a polyhedral cell $C_i$. Regions where no pressure center can be found may be iteratively clipped using the cell's faces to determine where to clip. When all irrelevant regions have been removed, a convex polyhedron p remains that represents the subdomain of $\mathbb{R}^3$ where points are acceptable pressure centers for cell $C_i$, i.e., any point inside polyhedron p may be valid as a pressure center.

For flow simulation, the computation of transmissibility is important for predicting accurately the fluid behavior within a reservoir, given a certain production plan. For example, two cells $C_1$ and $C_2$ share one (or more) face(s) F. The center of the face(s) F is $P_F$, and the center of cells $C_1$ and $C_2$ is $P_1$ and $P_2$, respectively. Transmissibility T between these two cells may be computed as:

$$T = \frac{T_1 \cdot T_2}{T_1 + T_2}$$

where $T_i$ is the half-transmissibility of cell $C_i$. Of course, it will be appreciated that if both of the half-transmissibilities are null, transmissibility cannot be computed using the formula above due to a division by zero. In such a situation, transmissibility may be set to null, which makes physical sense since no flow crosses the face from either side.

Each half-transmissibility $T_i$ may be computed as:

$$T_i = \mu \cdot \frac{K_i \cdot A}{D_i} \cdot \frac{\vec{n_t} \cdot \overrightarrow{P_t P_F}}{\|\vec{n_t} \cdot \overrightarrow{P_t P_F}\|}$$

where $\mu$ the viscosity of the fluid, $K_i$ the permeability of cell $C_i$, A the area of contact between the two cells, $D_i$ the distance between the pressure center $P_i$ of cell $C_i$ and the center $P_F$ of face(s) F, and $\vec{n_t}$ the normal of the face(s) F oriented towards the outside of cell $C_i$.

Half-transmissibility may provide a measure of how much fluid can transit from a cell to each of its faces. It only makes physical sense if it is positive or null (the latter meaning that no fluid can transit through the face, e.g., that the face is impermeable). However, if vectors $\vec{n_t}$ and $\overrightarrow{P_t P_F}$ are not oriented consistently, their dot product can be negative, resulting in non-physical negative half-transmissibilities—and therefore non-physical transmissibilities as well.

Figure 5B:
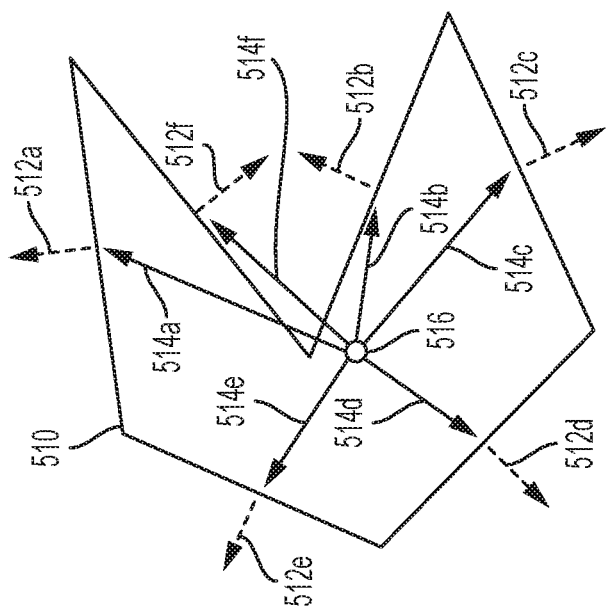
FIG. 5B illustrates an exemplary polygon having a negative dot product.
Figure 5A:
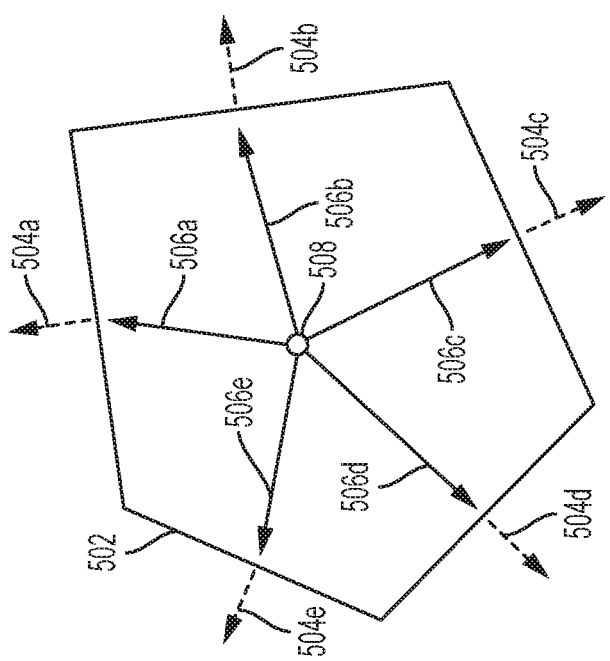
FIG. 5A illustrates an exemplary polygon having only positive dot products.

Referring to FIG. 5A, face 502 has normal vectors 504a-504e ($\vec{n_t}$) and vectors 506a-506e from the pressure center 508 to the edges ($\overrightarrow{P_t P_F}$). The dot product of the vectors 504a-504e and 506a-506e is positive. Referring to FIG. 5B, face 510 has several vectors that have positive dot products (normal vectors 512a-512e ($\vec{n_t}$) and vectors 514a-514e from the pressure center 516 to the edges ($\overrightarrow{P_t P_F}$)). However, normal vector 512f and vector 514f from the pressure center 516 to the edge have a negative dot product.

The negative dot product is a mathematical representation of a non-physical event such as fluid exiting the cell that did not enter the cell (e.g., being created). Such non-physical transmissibility, if included in the flow simulation, leads to inaccuracies. If a flow determination includes such values, these non-physical half-transmissibilities may eventually result in the prediction of non-physical fluid behaviors in the reservoir.

Preferably, the non-physical transmissibility (e.g., the negative dot product) is detected, computations are stopped and a warning is enunciated (for example, to a user) about why the determination is stopped. In this case, no prediction of production is provided and the user then has the option to perform (possibly time-consuming) remedial steps to overcome the issue. The simulator may also unexpectedly crash because it cannot solve the problem in the presence of non-physical transmissibilities.

The simulator may finish the computation in the presence of non-physical transmissibilities, producing incorrect values of expected production rates. This could bias any decisions made by the user based on this incorrect information, possibly resulting in financial losses. For instance, it may cause users to build a platform whose size does not match the actual production, resulting in spending unnecessary capital on too large a platform and/or lost revenue due to the use of too small a platform. Predicting completely wrong values of expected production rates due to too many non-physical features of the grid could also result in safety issues (e.g., well blowout) as well as financial losses (e.g., capital investment to drill a well or build a platform without obtaining the expected revenue as a result).

Figure 6:
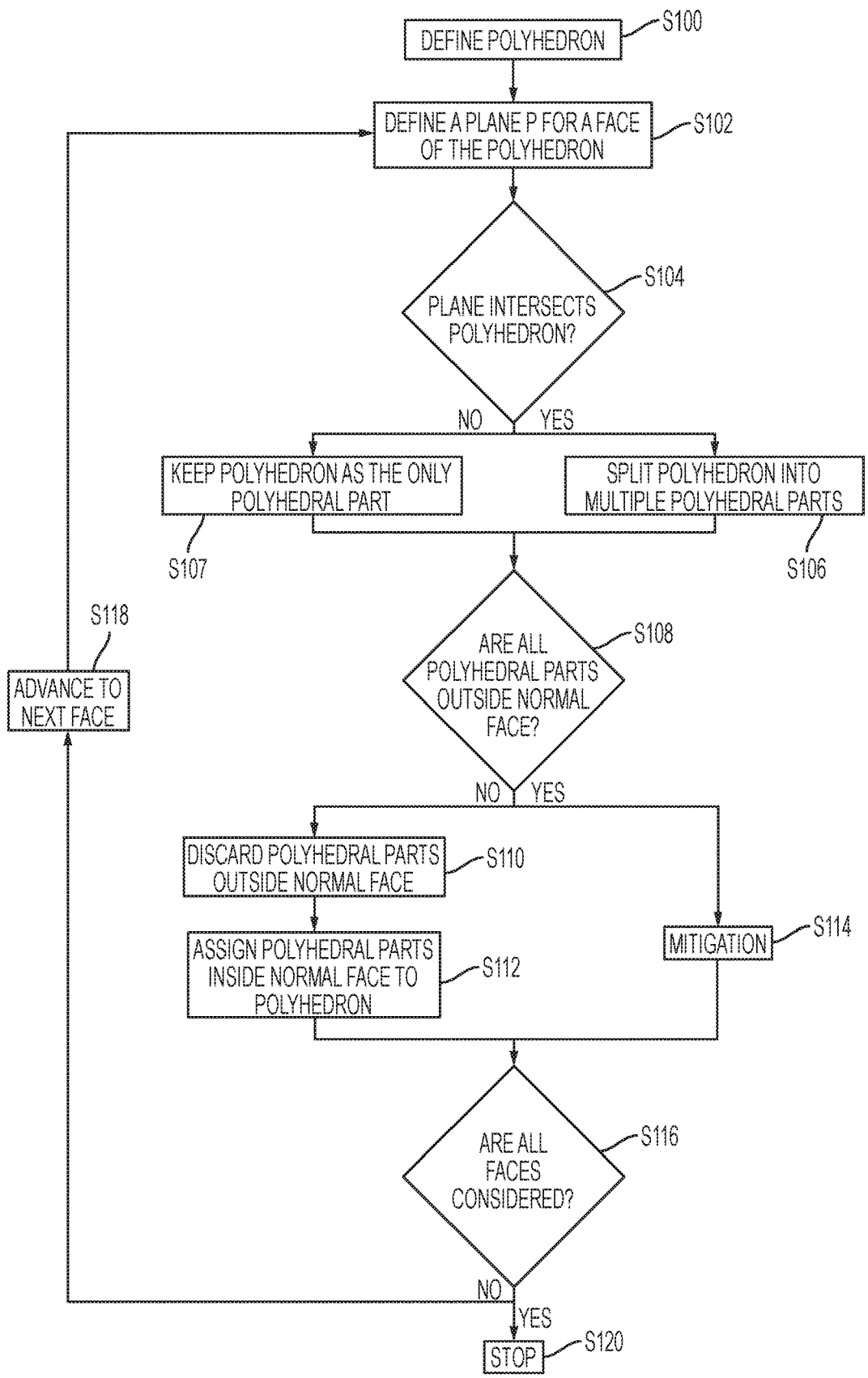
FIG. 6 illustrates an exemplary flow chart of bounding box clipping.
Figure 7A:
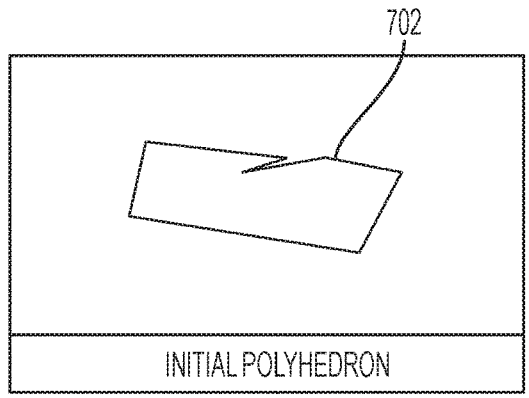
FIG. 7A illustrates an exemplary initial polygon.
Figure 7B:
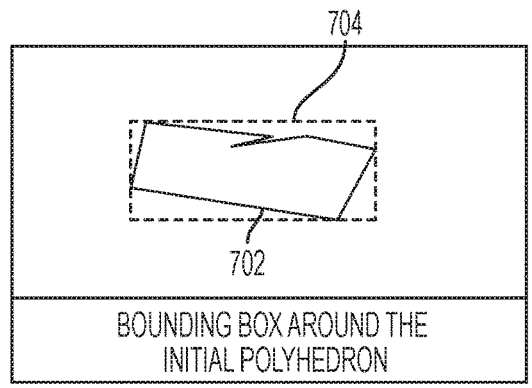
FIG. 7B illustrates an exemplary step of bounding box clipping.
Figure 7C:
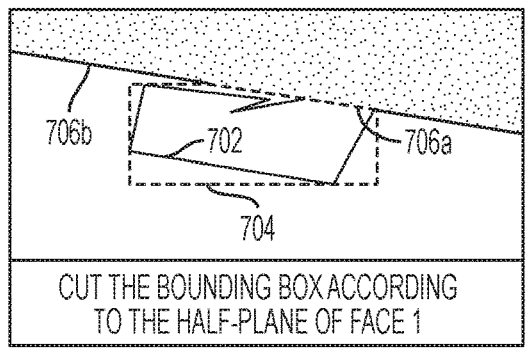
FIG. 7C illustrates an exemplary step of bounding box clipping.
Figure 7D:
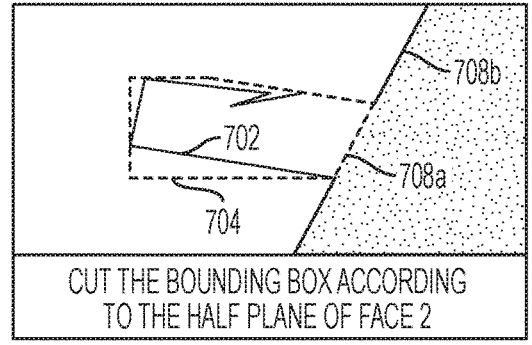
FIG. 7D illustrates an exemplary step of bounding box clipping.
Figure 7E:
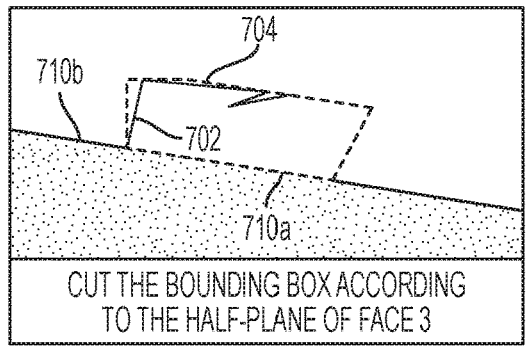
FIG. 7E illustrates an exemplary step of bounding box clipping.
Figure 7F:
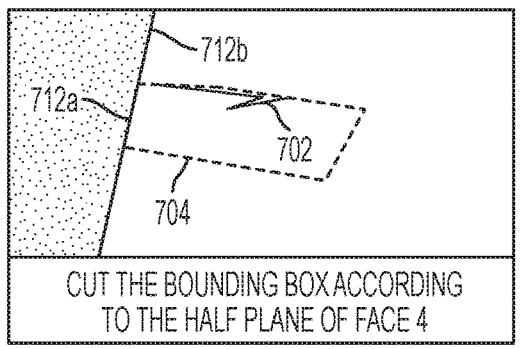
FIG. 7F illustrates an exemplary step of bounding box clipping.
Figure 7G:
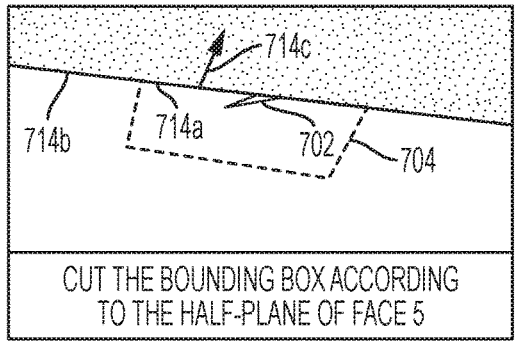
FIG. 7G illustrates an exemplary step of bounding box clipping.
Figure 7H:
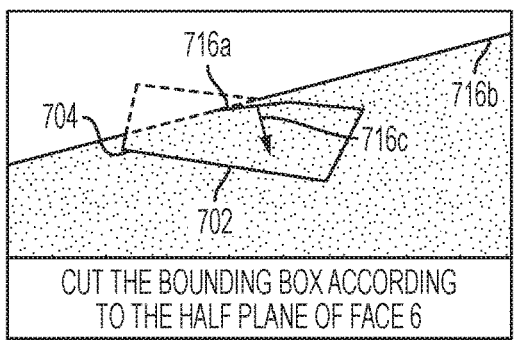
FIG. 7H illustrates an exemplary step of bounding box clipping.
Figure 7I:
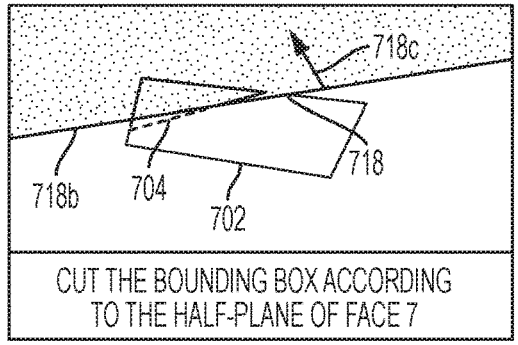
FIG. 7I illustrates an exemplary step of bounding box clipping.
Figure 7J:
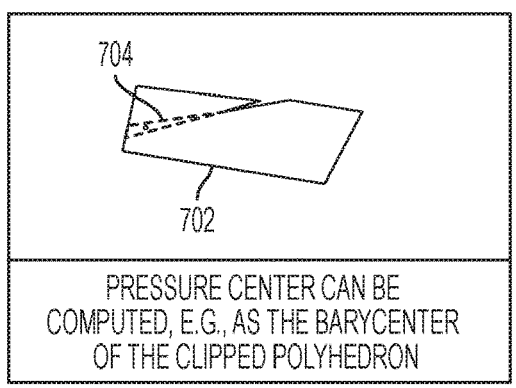
FIG. 7J illustrates an exemplary step of bounding box clipping.

Referring now to FIGS. 6 and 7, a process to remove or mitigate non-physical transmissibility will be discussed. In the following discussion, a cell center $P_i$ that produces positive dot products with every single face of the cell $C_i$ is referred to as a pressure center. For a convex polyhedron, such a pressure center can be determined by finding the barycenter of the cell, which is guaranteed to meet the requirements of a pressure center. However, for concave cells, the barycenter may not be a valid pressure center. For very concave cells, it may be mathematically impossible to find a pressure center, because no point in $\mathbb{R}^3$ can satisfy these requirements. For these highly concave cells, a pseudo-pressure center is determined that maximizes, e.g., the total surface of the cell interfaces that have a positive dot product between vectors $\vec{n_t}$ and $\overrightarrow{P_t P_F}$. Other interfaces can then be forced to have null half-transmissibilities, which reduces the impact of having non-physical transmissibility values in flow simulation.

In an initialization step S100, a polyhedron p is defined from the geometry of cell $C_i$. Polyhedron p can either replicate exactly the geometry of cell $C_i$, such as the polyhedron 702, or correspond to the bounding box of cell $C_i$, such as the bounding box 704. It may be easier to start from the bounding box of cell $C_i$, because it guarantees convex polyhedra later on, but either option may be used.

At step S102, a plane P (e.g., 706b) is defined by the center and outward-facing normal of face $F_i^j$ (e.g., 706a). If face $F_i^j$ is non-planar, it can also first be triangulated, in which case each plane P can be defined by the center and outward-facing normal of each triangle face $F_i^j$. The orientation of the normal of face $F_i^j$ defines a domain that will produce negative dot products with the face (that may be referred to as the "outside" domain) and a domain that will produce positive dot products with the face (that may be referred to as the "inside" domain).

At step S104, it is determined if the plane P intersects polyhedron p. If plane P intersects polyhedron p, polyhedron p is split in two (or more) parts $p_k$ at step S106. If plane P does not intersect polyhedron p, polyhedron p is kept as the only polyhedral part at step S107. At step S108, it is determined if all of the polyhedron p is in the outside domain (the side of the polyhedron outside the normal face). If not, then the parts $p_k$ that are in outside domain are discarded at step S110 (the side of the polyhedron outside the normal face is discarded), and the polyhedron p is assigned the part(s) $p_k$ that belong(s) to the inside domain at step S112. It will be appreciated that if polyhedron p is known to be convex (for example because it was initialized as the bounding box of cell $C_i$) and there is an intersection with plane P, the splitting procedure always produces two polyhedral parts $p_k$.

With reference to faces 706a, 708a, 710a, 712a, 714a, 716a and 718a, planes 706b, 708b, 710b, 712b, 714b, 716b and 718b intersect polyhedron p built from the bounding box of the source polyhedron 702. Thus, the portions on the negative side of the planes 706b, 708b, 710b, 712b, 714b, 716b and 718b are in the "outside domain" and clipped from polyhedron p.

If polyhedron p completely belongs to the inside domain, it will stay unchanged until another face is visited.

If at step S08, it is determined that polyhedron p completely belongs to the outside domain, there is no mathematical solution that fulfills the requirements of a pressure center. If deemed acceptable, mitigation strategies can still be applied at step S114 to produce a pseudo-pressure center, which may limit the impact of non-physical transmissibility values in flow simulation (discussed further below). If mitigation is deemed unacceptable, the algorithm is considered to have failed and stops here.

On those occasions where it is not mathematically possible or practicable to define a subdomain of $\mathbb{R}^3$ positive dot products, as a mitigation strategy, constraints can be released to find a pseudo-pressure center that will be valid for most (but not all) of the faces of polyhedral cell $C_i$. The faces that are unacceptable with respect to the pseudo-pressure center can then be forced as impermeable, in order to prevent non-physical results from significantly degrading the quality of the flow simulation outcomes.

At step S116, it is determined whether all faces have been considered. If not, then the process advances to the next face at step S118 and repeats the process from step S102. In this way, each face $F_i^j$ of cell $C_i$ is considered.

If the algorithm did not fail and step S120 is reached, after visiting each plane P, polyhedron p will be convex and correspond to the subdomain of $\mathbb{R}^3$ that satisfies the requirements of a pressure center for cell $C_i$. As a convex polyhedron, the barycenter of polyhedron p is an acceptable pressure center for cell $C_i$. Of course, it will be appreciated that any other point within the convex polyhedron p is also valid as a pressure point.

In another embodiment, if no pressure center can be found, the total area of faces $F_i^j$ of cell $C_i$ for which the dot product is positive may be maximized to produce a pseudo-pressure center that mitigates the impact of non-physical transmissibility values in flow simulation.

Initialization is the same as described above, but the clipping approach differs as follows:

The faces $F_i^j$ of cell $C_i$ are sorted from largest to smallest area (or any other criterion than the area, which may be used to measure how impactful the face is to the connectivity), and visited in that order.

When polyhedron p completely belongs to the outside domain of plane P, the algorithm does not stop. Instead, it leaves polyhedron p unchanged, as if it belonged to the inside domain. This means the face $F_i^j$ from which plane P was computed will have a negative dot product—however some other faces may still have positive dot products. Faces $F_i^j$ that would have negative dot products are tagged as impermeable.

After visiting each plane P, polyhedron p will correspond to the subdomain of $\mathbb{R}^3$ that produces positive dot products for all faces that were not tagged as impermeable—e.g., the whole subdomain of $\mathbb{R}^3$ where pseudo-pressure centers can be found. If polyhedron p was initialized as the bounding box of cell $C_i$, it is guaranteed to be convex, otherwise it could be concave or even defined by multiple polyhedral parts.

An exemplary benefit of the above described process is that more accurate flow modeling can be performed. Improved accuracy can provide significant economic and safety advantages by allowing for the right size equipment to be used for a well. Thus, production planning is improved.

Computing Systems

FIG. 10 depicts an example computing system 1100 in accordance with some embodiments. The computing system 1100 can be an individual computer system 1101A or an arrangement of distributed computer systems. The computer system 1101A includes one or more geosciences analysis modules 1102 that are configured to perform various tasks according to some embodiments, such as one or more methods disclosed herein. To perform these various tasks, geosciences analysis module 1102 executes independently, or in coordination with, one or more processors 1104, which is (or are) connected to one or more storage media 1106A. The processor(s) 1104 is (or are) also connected to a network interface 1108 to allow the computer system 1101A to communicate over a data network 1110 with one or more additional computer systems and/or computing systems, such as 1101B, 1101C, and/or 1101D (note that computer systems 1101B, 1101C and/or 1101D may or may not share the same architecture as computer system 1101A, and may be located in different physical locations, e.g., computer systems 1101A and 1101B may be on a ship underway on the ocean, while in communication with one or more computer systems such as 1101C and/or 1101D that are located in one or more data centers on shore, other ships, and/or located in varying countries on different continents). Note that data network 1110 may be a private network, it may use portions of public networks, it may include remote storage and/or applications processing capabilities (e.g., cloud computing).

A processor can include a microprocessor, microcontroller, processor module or subsystem, programmable integrated circuit, programmable gate array, or another control or computing device.

The storage media 1106A can be implemented as one or more computer-readable or machine-readable storage media. Note that while in the example embodiment of FIG. 10 storage media 1106A is depicted as within computer system 1101A, in some embodiments, storage media 1106A may be distributed within and/or across multiple internal and/or external enclosures of computing system 1101A and/or additional computing systems. Storage media 1106A may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs), BluRays or any other type of optical media; or other types of storage devices. "Non-transitory" computer readable medium refers to the medium itself (i.e., tangible, not a signal) and not data storage persistency (e.g., RAM vs. ROM).

Note that the instructions discussed above can be provided on one computer-readable or machine-readable storage medium, or alternatively, can be provided on multiple computer-readable or machine-readable storage media distributed in a large system having possibly plural nodes and/or non-transitory storage means. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

It should be appreciated that computer system 1101A is one example of a computing system, and that computer system 1101A may have more or fewer components than shown, may combine additional components not depicted in the example embodiment of FIG. 10, and/or computer system 1101A may have a different configuration or arrangement of the components depicted in FIG. 10. The various components shown in FIG. 10 may be implemented in hardware, software, or a combination of both, hardware and software, including one or more signal processing and/or application specific integrated circuits.

It should also be appreciated that while no user input/output peripherals are illustrated with respect to computer systems 1101A, 1101B, 1101C, and 1101D, many embodiments of computing system 1100 include computing systems with keyboards, mice, touch screens, displays, etc. Some computing systems in use in computing system 2100 may be desktop workstations, laptops, tablet computers, smartphones, server computers, etc.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the disclosure.

Of course, many processing techniques for collected data, including one or more of the techniques and methods disclosed herein, may also be used successfully with collected data types other than seismic data. While certain implementations have been disclosed in the context of seismic data collection and processing, those with skill in the art will recognize that one or more of the methods, techniques, and computing systems disclosed herein can be applied in many fields and contexts where data involving structures arrayed in a multi-dimensional space and/or subsurface region of interest may be collected and processed, e.g., medical imaging techniques such as tomography, ultrasound, MRI and the like for human tissue; radar, sonar, and LIDAR imaging techniques; mining area surveying and monitoring, oceanographic surveying and monitoring, and other appropriate multi-dimensional imaging problems.

Examples of equations and mathematical expressions have been provided in this disclosure. But those with skill in the art will appreciate that variations of these expressions and equations, alternative forms of these expressions and equations, and related expressions and equations that can be derived from the example equations and expressions provided herein may also be successfully used to perform the methods, techniques, and workflows related to the embodiments disclosed herein.

In some embodiments a method is provided in which a polyhedral grid representative of seismic data is provided. A polyhedral cell of the polyhedral grid is identified. A polyhedron that encloses the polyhedral cell is created. A region of the polyhedron to remove based at least in part on one or more faces of the identified polyhedral cell is identified. The identified region of the polyhedron is removed. The identifying and removing are repeated for a plurality of faces of the identified polyhedral cell. A pressure center of the polyhedral cell is determined.

In some embodiments, a method is provided in which a polyhedral grid representative of seismic data is provided. A polyhedral cell of the polyhedral grid is identified. A bounding box of the polyhedral cell is determined. For each face of the identified polyhedral cell, a plane and a vector normal to the plane is defined. A plane that intersects the polyhedral cell is identified. The bounding box of the polyhedral cell is split based at least in part on the plane. A portion of the bounding box is discarded based on the plane. The pressure center is determined from the modified bounding box.

In some embodiments, a geophysics processor includes a receiving portion, an identification portion and a processing portion. The receiving portion is configured to provide a polyhedral grid representative of seismic data. The identification portion is configured to identify a polyhedral cell, create a polyhedron that encloses the polyhedral cell, and identify a region of the polyhedron. The processing portion is configured to identify a portion of the region of the polyhedron to remove based on faces of the identified polyhedral cell, and to remove the identified portion of the region. The processing portion and the identifying portion are configured to continue the identifying and processing for a plurality of faces of the identified polyhedral cell.

In some embodiments, a computing system is provided that comprises at least one processor, at least one memory, and one or more programs stored in the at least one memory, wherein the programs comprise instructions, which when executed by the at least one processor, are configured to perform any method disclosed herein.

In some embodiments, a computer readable storage medium is provided, which has stored therein one or more programs, the one or more programs comprising instructions, which when executed by a processor, cause the processor to perform any method disclosed herein.

In some embodiments, a computing system is provided that comprises at least one processor, at least one memory, and one or more programs stored in the at least one memory; and means for performing any method disclosed herein.

In some embodiments, an information processing apparatus for use in a computing system is provided, and that includes means for performing any method disclosed herein.

In some embodiments, a graphics processing unit is provided, and that includes means for performing any method disclosed herein.

These systems, methods, processing procedures, techniques, and workflows increase effectiveness and efficiency. Such systems, methods, processing procedures, techniques, and workflows may complement or replace conventional methods for identifying, isolating, transforming, and/or processing various aspects of data that is collected from a subsurface region or other multi-dimensional space to enhance flow simulation prediction accuracy.

An exemplary benefit of some of the methods and computing systems of the present disclosure is that more effective and accurate methods for determining and/or predicting flow in a reservoir may be employed.

While any discussion of or citation to related art in this disclosure may or may not include some prior art references, applicant neither concedes nor acquiesces to the position that any given reference is prior art or analogous prior art.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to explain the principles of the invention and its practical applications, to thereby enable others skilled in the art to utilize the invention and various embodiments with various modifications as are suited to the particular use contemplated.

What is claimed is:

1. A method for finding a pressure center, comprising:
providing a polyhedral grid representative of seismic data;
identifying a polyhedral cell of the polyhedral grid;

creating a polyhedron that encloses the polyhedral cell;
identifying a region of the polyhedron to remove based at least in part on one or more faces of the identified polyhedral cell;
removing the identified region of the polyhedron;
repeating the identifying the region and the removing for a plurality of faces of the identified polyhedral cell to provide a bounding box;
determining the pressure center of the polyhedral cell using the bounding box;
performing a flow simulation using the polyhedral cell, the flow simulation including determining transmissibility between the polyhedral cell and an adjacent cell of the polyhedral grid using the pressure center to predict fluid behavior within a reservoir; and
determining equipment used for a well using the predicted fluid behavior.

2. The method of claim 1, wherein the creating the polyhedron includes copying geometry of the polyhedral cell.

3. The method of claim 1, wherein the repeating is repeated for all faces of the polyhedron.

4. The method of claim 1, wherein after the repeating, the polyhedron is convex.

5. The method of claim 4, wherein the convex polyhedron represents a subdomain where a pressure center may be determined for any point within the polyhedral cell.

6. The method of claim 5, wherein a pressure center may be determined for any point within the polyhedral cell when dot products of vectors from the respective points within the polyhedral cell and vectors normal to the faces of the polyhedral cell are positive.

7. The method of claim 1, wherein the identifying the region includes releasing constraints when it is not possible to determine a subdomain of points in which a pressure center can be found.

8. The method of claim 7, further comprising maximizing a total surface of the polyhedral cell that has positive dot products between vectors from respective points within the polyhedral cell and vectors normal to the faces of the polyhedral cell.

9. The method of claim 7, further comprising flagging faces of the polyhedral cell for which constraints were released as impermeable.

10. The method of claim 1, further comprising performing a flow simulation including the polyhedral cell.

11. A non-transitory computer readable medium having instructions for causing a processor to perform the method of claim 1.

12. The method of claim 1, wherein the identifying the region includes identifying a region where a pressure center can not be found.

13. A method for finding a pressure center, comprising:
providing a polyhedral grid representative of seismic data;
identifying a polyhedral cell of the polyhedral grid;
determining a bounding box of the polyhedral cell;
for each face of the identified polyhedral cell, defining a plane and a vector normal to the plane;
identifying a plane that intersects the polyhedral cell;
splitting the bounding box of the polyhedral cell based at least in part on the plane;
discarding a portion of the bounding box based on the plane to provide a modified bounding box;
determining the pressure center from the modified bounding box;
performing a flow simulation, the flow simulation including determining transmissibility between the polyhedral cell and an adjacent cell of the polyhedral grid using the pressure center to predict fluid behavior within a reservoir; and
determining whether to drill a well, determining equipment used for a well, or determining a production plan using the predicted fluid behavior.

14. The method of claim 13, wherein the discarding the portion of the bounding box includes discarding a portion associated with the split polyhedral cell with points that form a negative dot product with the vector normal to the plane.

15. The method of claim 13, wherein in the splitting the polyhedral cell, if there is no region associated with points that form a negative dot product with the vector normal to the plane, the polyhedral cell is split based on a determination of a pseudo-pressure center.

16. The method of claim 15, wherein the determination of the pseudo-pressure center limits non-physical transmissibility values in a flow simulation.

17. The method of claim 13, wherein after the splitting, a portion of the polyhedral cell is convex.

18. The geophysics processor of claim 17, wherein the processing portion is configured to, for each face of the identified polyhedral call, define a plane and a vector normal to the plane, identify a plane that intersects the region, and split the region based on the plane.

19. The geophysics processor of claim 17, wherein the geophysics processor includes a graphic processing unit that is programmed to provide the receiving portion, the identifying portion, and the processing portion.

20. The method of claim 13, wherein faces of the polyhedral cell are sorted from largest to smallest and processed in that order.

21. A geophysics processor, comprising:
a receiving portion configured to provide a polyhedral grid representative of seismic data;
an identification portion configured to identify a polyhedral cell, create a polyhedron that encloses the polyhedral cell, and identify a region of the polyhedron;
a processing portion configured to identify a portion of the region of the polyhedron to remove based at least in part on faces of the identified polyhedral cell, and to remove the identified portion of the region, wherein the processing portion and the identifying portion are configured to continue the identifying and processing for a plurality of faces of the identified polyhedral cell to provide a bounding box;
a determining portion configured to determine the pressure center of the polyhedral cell using the bounding box;
a performing portion configured to perform a flow simulation using the polyhedral cell, the flow simulation including determining transmissibility between the polyhedral cell and an adjacent cell of the polyhedral grid using the pressure center to predict fluid behavior within a reservoir; and
a second determining portion configured to determine whether to drill a well, determining equipment used for a well, or determining a production plan using the predicted fluid behavior.

22. A method for finding a pressure center, comprising:
providing a polyhedral grid representative of seismic data;
identifying a polyhedral cell of the polyhedral grid;
creating a polyhedron that encloses the polyhedral cell;
identifying a region of the polyhedron to remove based at least in part on one or more faces of the identified polyhedral cell;

removing the identified region of the polyhedron;
repeating the identifying the region and the removing for a plurality of faces of the identified polyhedral cell to provide a bounding box;
determining the pressure center of the polyhedral cell using the bounding box;
performing a flow simulation using the polyhedral cell, the flow simulation including determining transmissibility between the polyhedral cell and an adjacent cell of the polyhedral grid using the pressure center to predict fluid behavior within a reservoir; and
determining whether to drill a well, determining equipment used for a well, or determining a production plan using the predicted fluid behavior.

* * * * *